United States Patent
Sharma et al.

(10) Patent No.: US 9,933,487 B2
(45) Date of Patent: Apr. 3, 2018

(54) SYSTEM AND METHOD FOR DETECTING, LOCALIZING, AND QUANTIFYING STATOR WINDING FAULTS IN AC MOTORS

(71) Applicant: Eaton Corporation, Cleveland, OH (US)

(72) Inventors: Santosh Kumar Sharma, Viman Nagar (IN); Rahul Choudhary, Kharadi (IN); Steven Andrew Dimino, Wauwatosa, WI (US)

(73) Assignee: Eaton Corporation, Cleveland, OH (US)

( * ) Notice: Subject to any disclaimer, the term of this patent is extended or adjusted under 35 U.S.C. 154(b) by 671 days.

(21) Appl. No.: 14/230,260

(22) Filed: Mar. 31, 2014

(65) Prior Publication Data
US 2015/0276880 A1 Oct. 1, 2015

(51) Int. Cl.
*G01R 31/06* (2006.01)
*G01R 31/34* (2006.01)
(Continued)

(52) U.S. Cl.
CPC ....... *G01R 31/346* (2013.01); *G01R 19/0046* (2013.01); *H02P 29/0243* (2016.02); *H02P 2207/01* (2013.01)

(58) Field of Classification Search
CPC .............. G01R 31/346; G01R 19/0046; H02P 29/0243; H02P 2207/01
(Continued)

(56) References Cited

U.S. PATENT DOCUMENTS 5,270,640 A * 12/1993 Kohler ................. G01R 31/343
324/765.01
6,144,924 A 11/2000 Dowling et al.
(Continued)

FOREIGN PATENT DOCUMENTS

GB 858638 A 1/1961
GB 2362275 A 11/2001
(Continued)

OTHER PUBLICATIONS

Bouzid et al., "A Novel Reliable Indicator of Stator Windings Fault in Induction Motor Extracted From the Symmetrical Components," 2011 IEEE International Symposium on Industrial Electronics (ISIE), Jun. 27, 2011, pp. 489-495.
(Continued)

*Primary Examiner* — Giovanni Astacio-Oquendo
(74) *Attorney, Agent, or Firm* — Ziolkowski Patent Solutions Group, SC

(57) ABSTRACT

A system and method for detecting, localizing and quantifying stator winding faults in AC electrical machines is disclosed. A diagnostic system configured to detect a stator winding fault in an AC electrical machine includes a processor programmed to receive measurements of three-phase voltages and currents provided to the AC electrical machine from voltage and current sensors associated with the electrical distribution circuit, compute positive, negative and zero sequence components of voltage and current from the three-phase voltages and currents, and calculate a fault severity index (FSI) based on at least a portion of the positive, negative and zero sequence components of voltage and current, wherein calculating the FSI further comprises identifying a voltage gain in one or more phases of the AC electrical machine due to a stator winding fault and local-
(Continued)

izing the stator winding fault to one or more phases in the AC electrical machine.

20 Claims, 8 Drawing Sheets

(51) Int. Cl.
  *G01R 19/00* (2006.01)
  *H02P 29/024* (2016.01)
(58) Field of Classification Search
  USPC .......................................... 324/545, 500, 537
  See application file for complete search history.

(56) References Cited

U.S. PATENT DOCUMENTS

| | | | |
|---|---|---|---|
| 7,592,772 B2 * | 9/2009 | Nandi ................. | H02P 29/0241 318/798 |
| 8,031,446 B2 * | 10/2011 | Hsieh ....................... | H02H 7/09 318/798 |
| 2005/0007096 A1 * | 1/2005 | Dimino .............. | G05B 23/0229 324/142 |
| 2007/0041137 A1 * | 2/2007 | Thompson ............. | H02H 7/045 361/85 |
| 2009/0146599 A1 * | 6/2009 | Zhou .................... | G01R 31/343 318/490 |
| 2010/0060289 A1 * | 3/2010 | Wiedenbrug .......... | G01R 31/04 324/511 |
| 2011/0134669 A1 * | 6/2011 | Yuzurihara ........... | H02M 7/219 363/89 |
| 2015/0276827 A1 * | 10/2015 | Sharma ................ | G01R 31/086 702/60 |

FOREIGN PATENT DOCUMENTS

| | | |
|---|---|---|
| KR | 905443 B1 | 5/2007 |
| KR | 925148 | 11/2007 |
| KR | 2011096828 | 2/2010 |
| WO | 2013004285 A1 | 1/2013 |

OTHER PUBLICATIONS

Wang, "An Analytical Study on Steady-state Performance of an Induction Motor Connected to Unbalanced Three-phase Voltage," Dept. of Electr. Eng., Nat. Yun-Lin Univ. of Sci. & Technol., Taiwan, Power Engineering Society Winter Meeting, 2000, IEEE, pp. 159-164.
Al-Diab et al., "Unbalanced Voltage Drops Compensations Using Flywheel Energy Storage System," 2011 11th International Conference on Electrical Power Quality and Utilisation (EPQU), Res. Group for Power Syst. Technol., Ruhr-Univ. Bochum, Bochum, Germany, pp. 1-6.
Chindris et al., "Propagation of Unbalance in Electric Power Systems," 9th International Conference, Electrical Power Quaility and Utilisation, Barcelona, Oct. 9-11, 2007, pp. 1-5.
Yun et al., "Online Detection of High-Resistance Connections in the Incoming Electrical Circuit for Induction Motors," IEEE Transactions on Industry Applications, vol. 45, No. 2, Mar./Apr. 2009, pp. 694-702.
Yoon et al., "Automated Monitoring of High-Resistance Connections in the Electrical Distribution System of Industrial Facilities," Dept. of Electr. Eng., Korea Univ., Seoul, Industry Applications Society Annual Meeting, 2008, IAS '08, IEEE, pp. 1-8.
Yun et al., "Detection and Classification of Stator Turn Faults and High-Resistance Electrical Connections for Induction Machines," IEEE Transaction on Industry Applications, vol. 45, No. 2, Mar./Apr. 2009, pp. 666-675.
Wu et al., "Improved Online Condition Monitoring Using Static Eccentricity-Induced Negative Sequence Current Information in Induction Machines," Sch. of Electr. & Comput. Eng., Georgia Inst. of Technol., Atlanta, GA, USA, 31st Annual Conference of IEEE Industrial Electronics Society, 2005, IECON 2005, pp. 1737-1742.

* cited by examiner

SYSTEM AND METHOD FOR DETECTING, LOCALIZING, AND QUANTIFYING STATOR WINDING FAULTS IN AC MOTORS

BACKGROUND OF THE INVENTION

The present invention relates generally to three-phase alternating current (AC) electrical machines or motors and, more particularly, to a system and method for detecting, localizing and quantifying stator winding faults in such electrical machines.

In industrial facilities, electrical machines such as generators, AC motors, and/or transformers are used in various applications. As one example, induction motors are used for applications like pumping, cooling, material movement, and other applications where cost-efficient and robust motors are required. An electrical distribution system is used in conjunction with electrical machines in such applications, with the electrical distribution system including protection and control components such as breakers, contactors, starters, etc.

In a three-phase system having an electrical distribution system and an AC electrical machine, it is recognized that various factors can lead to three-phase voltage asymmetry/imbalance in the system. That is, both high resistance connections and stator winding faults (stator winding fault) alter the resistance in the system, thereby leading to the three-phase voltage asymmetry/imbalance.

With respect to the high resistance connections in the system, improper connection of protection and/or control components (e.g., when electrical connections become loose or have less wire binding force) can cause high resistance connections to develop in the circuit and accordingly cause excess voltage drops (EVDs) to occur in the distribution circuit. These EVDs can lead to abnormal power dissipation at the connections and correspondingly to over-heated contacts or hot spots in the connections that can initiate fire and equipment damage. Even at an early stage, the voltage drops lead to energy losses as line drops, in effect reducing motor efficiency and motor life for example.

With respect to the stator winding faults in the system, these faults may be caused by the gradual deterioration of winding insulation due to a combination of electromechanical-force-induced vibration, high dv/dt voltage surges, thermal overload, and/or contamination. If a stator winding fault occurs and the windings of the stator are shorted, a large circulating fault current is induced in the shorted turn, leading to localized thermal overloading. This localized thermal overloading can eventually result in motor breakdown due to ground-fault/phase-to-phase-insulation or open-circuit failure within a short period of time, if left undetected.

In light of the above, it is desirable to detect high resistance connections and stator winding faults in an efficient and cost effective manner, so as to identify improper electrical connections in the circuit and faults in the stator winding. However, it is recognized that some existing sensor-less techniques developed for detecting both high resistance connections and stator winding faults rely on a main approach/concept of monitoring the influence of the "change" in the asymmetry of the three-phase system, since the faults occur in one of the phases. Therefore, these sensor-less techniques are based on similar indicators such as the negative-sequence current, relative angle between phases, etc., such that distinguishing between the types of faults can be difficult. Such distinguishing between the two faults, however, is desirable as it allows maintenance to be performed in a more flexible and efficient manner, since the course of action can be determined depending on the type and severity of the fault and the application.

It would therefore be desirable to provide a system and method that is capable of detecting an imbalance in a three-phase voltage and differentiating between such an imbalance being caused by a high resistance connection or a stator winding fault. It would also be desirable for such a system and method to localize a detected high resistance connection/stator winding fault to a particular phase or phases of the distribution circuit and quantify the voltage drop or voltage gain associated with the fault.

BRIEF DESCRIPTION OF THE INVENTION

In accordance with one aspect of the present invention, a diagnostic system in operable communication with an electrical distribution circuit and configured to detect a stator winding fault in an AC electrical machine comprising a plurality of stator windings is provided, with the diagnostic system including a processor programmed to receive measurements of three-phase voltages and currents provided to the AC electrical machine from voltage and current sensors associated with the electrical distribution circuit, compute positive, negative and zero sequence components of voltage and current from the three-phase voltages and currents, and calculate a fault severity index (FSI) based on at least a portion of the positive, negative and zero sequence components of voltage and current, wherein calculating the FSI further comprises identifying a voltage gain in one or more phases of the AC electrical machine due to a stator winding fault and localizing the stator winding fault to one or more phases in the AC electrical machine.

In accordance with another aspect of the invention, an electrical distribution circuit includes an input connectable to an AC source and an output connectable to terminals of an electrical machine to provide three-phase power thereto, the electrical machine comprising a plurality of stator windings. The electrical distribution circuit also includes a diagnostic system configured to identify a stator fault in the stator windings of the electrical machine, the diagnostic system including a processor that is programmed to receive measurements of three-phase supply voltages and currents provided to the electrical machine from voltage and current sensors connected to the electrical distribution circuit between the input and the output, compute positive, negative, and zero sequence components for the supply voltages and currents, determine a stator fault negative sequence voltage from the negative sequence voltage component, determine a localization reference phase angle for each phase based in part on fundamental components of the three-phase currents, and identify and localize a stator fault in the electrical distribution circuit based on the stator fault negative sequence voltage and the localization reference phase angles.

In accordance with yet another aspect of the invention, a method for identifying a resistance-based fault in an electrical distribution circuit includes measuring three-phase voltages and currents provided to terminals of an electrical machine in the electrical distribution circuit by way of voltage and current sensors, the electrical machine comprising a plurality of stator windings. The method also includes causing a diagnostic system to identify a resistance-based fault in the electrical distribution circuit and the stator windings of the electrical machine, wherein causing the diagnostic system to identify the resistance-based fault includes receiving the measured three-phase voltages and currents provided to the terminals of the electrical machine, computing a positive, negative, and zero sequence voltage and sequence current from the measured three-phase voltages and currents, detecting a voltage gain or voltage drop in one or more phases of the electrical distribution circuit using the positive, negative and zero sequence components of voltage and current and identifying a resistance-based fault in one or more phases of the electrical distribution circuit based on the detected voltage gain or voltage drop, wherein identifying the resistance-based fault comprises classifying the resistance-based fault as a high resistance fault between the input and output of the electrical distribution circuit if a voltage drop is detected and classifying the resistance-based fault as a stator fault in the stator windings if a voltage gain is detected.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

The embodiments of the invention set forth herein relate to a system and method for detecting, localizing and quantifying stator winding faults in three-phase AC electrical machines. The system and method is also able to differentiate between a stator winding fault and a high resistance connection, so as to provide for proper maintenance to be performed on the electrical machine in a flexible efficient manner.

Figure 1:
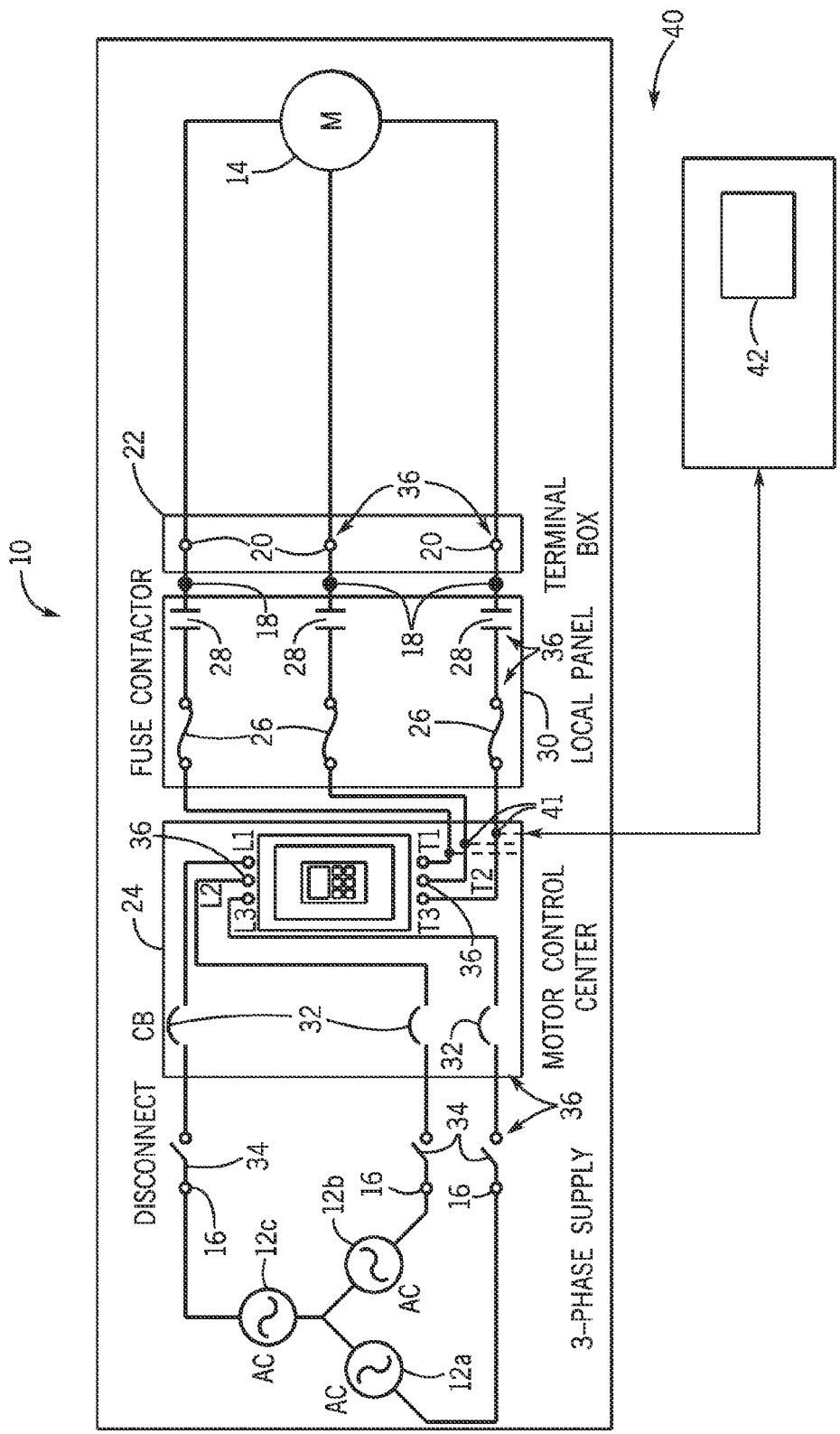
FIG. 1 is a schematic view of a three-phase electrical distribution circuit for use with embodiments of the present invention.

Referring to FIG. 1, a three-phase electrical distribution circuit 10 is shown according to an embodiment of the invention. The electrical distribution circuit 10 is connected between a three-phase AC input 12a-12c and a load 14, such as an AC electrical machine, to provide protection to the electrical machine and to condition power from the three-phase AC input 12a-12c for delivery to the machine. According to one embodiment of the invention, the electrical machine 14 is in the form of an induction motor 14, and thus is referred to hereafter in FIG. 1 as induction motor 14. However, it is recognized that the electrical machine 14 could also be a generator or transformer, for example, or any other load that might be driven by a three-phase power and useful in an industrial setting.

The electrical distribution circuit 10 includes an input 16 that is connectable to three-phase AC input 12a-12c to receive power therefrom. The electrical distribution circuit 10 also includes a three-phase output 18 that is connectable to motor terminals 20 of the induction motor to provide three-phase voltages and currents to the induction motor 14. According to one embodiment, the output 18 can be connected to motor terminals 20 at a terminal box 22 of the electrical distribution circuit 10, for example.

As further shown in FIG. 1, a plurality of circuit components are included in electrical distribution circuit 10 that are positioned between the input 16 and the output 18—with the circuit components providing protection from and control of voltage and current that is provided from the three-phase AC input 12a-12c for delivery to the induction motor 14. A number of such protection and control components are shown in FIG. 1, but it is recognized that other components could also/instead be included in electrical distribution circuit 10 according to embodiments of the invention. In the embodiment of electrical distribution circuit 10 shown in FIG. 1, a motor control center (MCC) 24 is shown as being included in the circuit. The motor control center 24 may comprise an assembly of one or more enclosed sections having a common power bus and containing a number of motor control units—such as a number of motor starters. The motor control center 24 can also include variable frequency drives, programmable controllers, and metering. Associated with operation of the motor control center 24 are a number of protection components/devices to protect the motor 14, provide short-circuit protection, and/or isolate the motor circuit. For example, fuses 26 and contactors 28 are provided in the electrical distribution circuit 10, such as in a local electrical panel 30, to provide for short-circuit protection and control of the induction motor 14. A circuit breaker 32 and disconnect switch 34 are also provided to provide short-circuit protection and isolation of the electrical distribution circuit 10.

It is recognized that the electrical distribution circuit 10 shown in FIG. 1 is merely illustrative of a motor electrical distribution circuit that may be associated with an embodiment of the present invention, and that three-phase AC circuits of various configurations and arrangements could instead be provided according to embodiments of the invention.

With respect to the electrical distribution circuit 10 shown in FIG. 1, it is desirable to be able to detect various types of faults that can occur in the circuit that might alter the resistance thereof. One example of a resistance-based fault is a high resistance connection. High resistance connections are a common problem that can occur at the joint/connection of any device connected between the source and the motor, such as at electrical connections made in the circuit to connect components 24, 26, 28, 32, 34 therein to one another and to the induction motor 14—with these electrical connections generally referenced as 36 in FIG. 1. These high resistance connections can occur due to a combination of poor workmanship, loosening of connections (due to thermal cycling and vibration), damage of contact surfaces (pitting, corrosion, or contamination), etc. It is recognized that a high resistance connection of protection and/or control components can lead to excess voltage drops (EVD) in the motor circuit, with such voltage drops leading to abnormal power dissipation at the connections and correspondingly to over-heated contacts or hot spots in the connections that can initiate fire and equipment damage, energy losses as line drops, motor efficiency loss, and motor life reduction.

Another example of a resistance-based fault that can occur in the electrical distribution circuit 10 is a stator winding fault. Stator winding faults may be caused by the gradual deterioration of stator winding insulation due to a combination of electromechanical-force-induced vibration, high dv/dt voltage surges, thermal overload, and/or contamination. If a stator winding fault occurs and the windings of the stator are shorted, a large circulating fault current is induced in the shorted winding, leading to localized thermal overloading. This localized thermal overloading can eventually result in motor breakdown due to ground-fault/phase-to-phase-insulation or open-circuit failure within a short period of time, if left undetected.

In order to provide for detection of such high resistance faults and stator winding faults, a diagnostic system 40 is included in the electrical distribution circuit 10, according to an embodiment of the invention. The diagnostic system 40 receives an input regarding the three-phase supply voltage and current provided to the induction motor 14. According to an exemplary embodiment, the diagnostic system 40 receives voltage and current measurements acquired from voltage and current sensors (generally indicated as 41) integrated into a motor starter(s) in the MCC 24; however, it is recognized that separate dedicated voltage and current sensors could be included in electrical distribution circuit 10 to acquire voltage and current data from a location between the input 16 and the output 18 and provide it to diagnostic system 40. As shown in FIG. 1, a processor 42 in the diagnostic system 40 receives the measured three-phase voltages and currents and is programmed to analyze the data to identify a resistance-based fault in the electrical distribution circuit 10. In identifying a resistance fault in the electrical distribution circuit 10, the diagnostic system 40 is able to differentiate between a high resistance connection fault (e.g., due to a loose connection) that causes an EVD in the distribution circuit from a stator winding fault (e.g., due to degraded winding insulation) that causes an increase in voltage (voltage gain) in one or more phases in the distribution circuit 10. The diagnostic system 40 calculates a fault severity index (FSI) having a magnitude that is an indicator of the type of resistance fault present in the electrical distribution system and an angle that indicates the phase which has the resistance fault.

While the diagnostic system 40 is shown in FIG. 1 as being in the form of a standalone product/device, it is recognized that such a system could be incorporated into a protection and control component included in the electrical distribution circuit 10. That is, a processor 42 having a program/algorithm thereon that enables detection of high resistance faults and stator winding faults in the electrical distribution circuit 10 can reside in an existing starter, relay, drive, breaker, motor control center and/or other motor control or protection product in the electrical distribution circuit 10. The diagnostic system 40 can thus provide online monitoring of the electrical distribution circuit 10 from a location of the distribution circuit or at a location remote from the distribution circuit.

Furthermore, while embodiments of the inventors are described here below with respect to the processor 42 of diagnostic system 40 being programmed to perform a technique to identify an EVD fault in the electrical distribution circuit 10, it is recognized that the term "processor" as used herein need not be a programmable device. That is, it is to be understood that the processor 42 (and the steps performed thereby), as described hereafter, also covers equivalent hardware and computing devices that perform the same tasks.

According to embodiments of the invention, for purposes of detecting the existence of a voltage drop or voltage gain in a three-phase motor circuit, the method of symmetrical components is employed to simplify the analysis of the motor circuit as it becomes unbalanced. The asymmetrical/unbalanced phasors (voltages and currents) are represented as three symmetrical sets of balanced phasors—the first set has the same phase sequence as the system under study (positive sequence, e.g., ABC), the second set has the reverse phase sequence (negative sequence, e.g., ACB), and in the third set the phasors A, B and C are in phase with each other (zero sequence). Essentially, this method converts three unbalanced phases into three independent sources, which makes asymmetric fault analysis more tractable. Using the sequence phasors of voltages and currents, a fault severity index (FSI) is calculated, the magnitude of which is an indicator of the amount of voltage gain or voltage drop in the circuit and the angle of which indicates the phase or phases which has/have the voltage gain/voltage drop.

Figure 2:
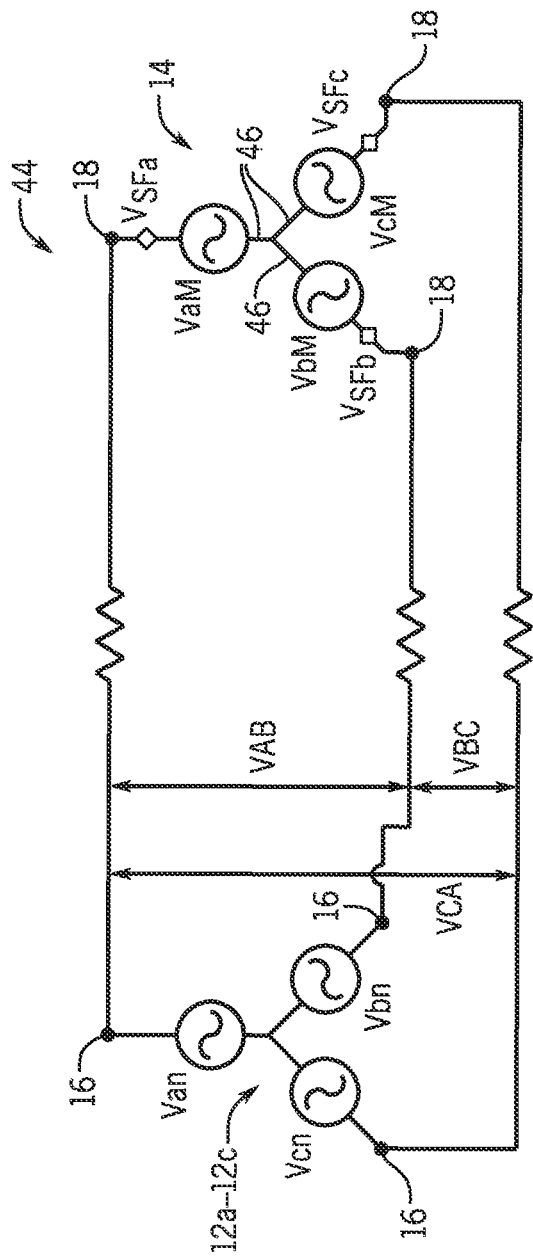
FIG. 2 is a schematic diagram of a motor circuit with high resistance connection faults and/or stator winding faults present therein according to an embodiment of the invention.

Embodiments of the invention are provided for detecting the existence of a resistance-based fault in an AC electrical machine—including in a delta connected motor circuit or a star connected motor circuit. An illustration of a general induction motor circuit 44 is provided in FIG. 2. In FIG. 2, the supply line voltages $V_a$, $V_b$, $V_c$ are illustrated, as are the phase voltages at the motor terminals $V_{aM}$, $V_{bM}$, $V_{cM}$ that are present at the motor. The motor terminal voltages that are present are determined in part by any stator winding faults present in the stator windings 46 of the electrical machine (on one or more of the phases), which are indicated as $V_{SFa}$, $V_{SFb}$, $V_{SFc}$, and/or by any EVDs present in the motor circuit 46 on one or more of the phases, which are indicated as $V_{EVDa}$, $V_{EVDb}$, $V_{EVDc}$.

Figure 3:
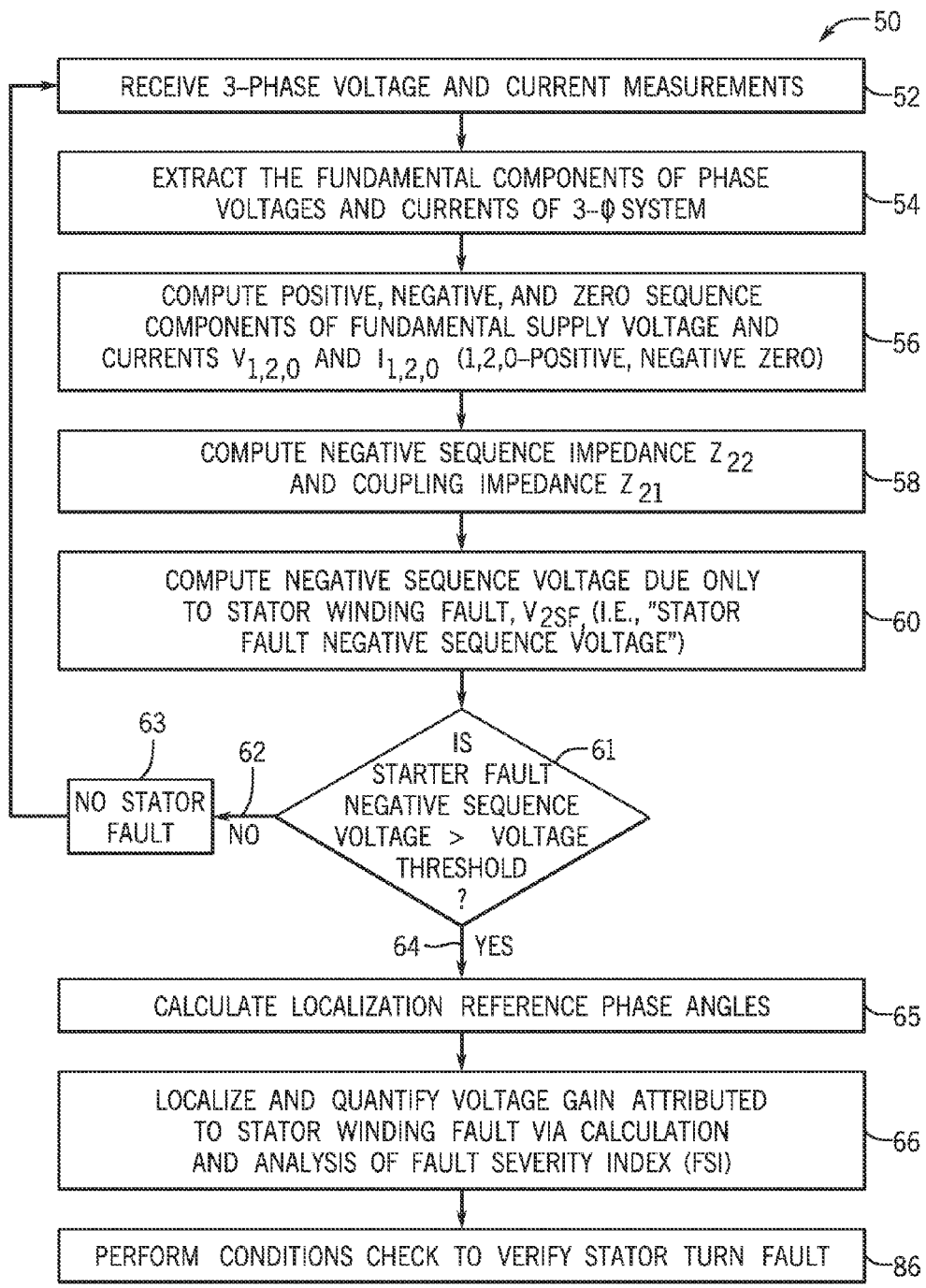
FIG. 3 is a flowchart illustrating a technique for detecting excess voltage drops in three-phase AC circuits according to an embodiment of the invention.

Referring now to FIG. 3, and with continued reference to FIGS. 1 and 2, a technique 50 is illustrated that is implemented by the processor 42 of diagnostic system 40 to identify, localize and quantify stator winding fault(s) in a delta or star connected electrical distribution (motor) circuit 10, according to an embodiment of the invention. It is recognized that the technique 50 for identifying, localizing and quantifying stator winding faults (and the steps included therein) is identical for a delta connected motor and a star connected motor.

In a first step of the technique 50, three-phase current and voltage measurements are received by the processor 42 at STEP 52. According to an exemplary embodiment, the processor 42 receives three-phase current and voltage data as measured in the MCC (i.e., at a sensing location between the input 16 and the output 18), with the voltages and currents from the MCC 24 being subsequently supplied to the terminals 20 of the electrical machine 14—such as an induction motor, for example. Upon receiving the three-phase current and voltage measurements, the processor 42 then extracts the fundamental components of the three-phase currents and voltages at STEP 54 according to a known technique/method. STEP 54 is shown in phantom in FIG. 3 as it is recognized that determination of the fundamental components is optional for performing of the technique 50—as detecting, localizing and quantifying a stator winding fault in the electrical distribution circuit 10 can be performed without the fundamental components. However, it is recognized that a more accurate analysis of stator winding faults is achieved via determination and use of the fundamental components, as is described here below.

As shown in FIG. 3, the technique 50 continues with the computing of sequence components of the fundamental supply voltages and currents at STEP 56, with the sequence components of the voltages being identified as $V_{1,2,0}$ and the sequence components of the currents being identified as $I_{1,2,0}$, where the positive, negative and zero sequence components are identified by 1, 2, and 0, respectively. With respect to determining the voltage sequence components, it is recognized that Kirchoff's Voltage Law (KVL) can be applied to the connected distribution circuit to describe the relationship between the supply line voltages, phase voltages at the motor terminals, and the stator faults in equation form according to:

$$\begin{bmatrix} V_{aM} \\ V_{bM} \\ V_{cM} \end{bmatrix} = \begin{bmatrix} V_a \\ V_b \\ V_c \end{bmatrix} + \begin{bmatrix} V_{SFa} \\ V_{SFb} \\ V_{SFc} \end{bmatrix},$$ [Eqn. 1]

where $V_{aM}, V_{bM}, V_{cM}$ are the three-phase voltages across the motor windings, $V_a, V_b, V_c$ are the three-phase line voltages (as measured at a sensing location), and $V_{SFa}, V_{SFb}, V_{SFc}$ are voltage gain due to stator fault in the phase A, B, C, respectively.

The positive, negative and zero sequence components voltages can be obtained by applying a transformation T to Eqn. 1. According to one embodiment, a sequence transformation T is utilized that is defined according to:

$$T = \frac{1}{3}\begin{bmatrix} 1 & 1 & 1 \\ 1 & a & a^2 \\ 1 & a^2 & a \end{bmatrix}, \text{ where } a = 1\angle 120 = -0.5 + j\frac{\sqrt{3}}{2}$$

(i.e., a unit vector at an angle of 120 degrees).

Applying the transformation T to Eqn. 1 yields:

$$T * \begin{bmatrix} V_{aM} \\ V_{bM} \\ V_{cM} \end{bmatrix} = T * \begin{bmatrix} V_a \\ V_b \\ V_c \end{bmatrix} + T * \begin{bmatrix} V_{SFa} \\ V_{SFb} \\ V_{SFc} \end{bmatrix}.$$ [Eqn. 2]

Considering the line drops in each phase are equal (i.e., no additional unbalance seen by the stator windings), then Eqn. 2 can be rewritten as:

$$\begin{bmatrix} V_{0M} \\ V_{1M} \\ V_{2M} \end{bmatrix} = \frac{1}{3}\begin{bmatrix} 1 & 1 & 1 \\ 1 & a & a^2 \\ 1 & a^2 & a \end{bmatrix}\begin{bmatrix} V_a \\ V_b \\ V_c \end{bmatrix} + \frac{1}{3}\begin{bmatrix} 1 & 1 & 1 \\ 1 & a & a^2 \\ 1 & a^2 & a \end{bmatrix}\begin{bmatrix} V_{SFa} \\ V_{SFb} \\ V_{SFc} \end{bmatrix},$$ [Eqn. 3]

where $V_{0M}, V_{1M}$ and $V_{2M}$ are the zero, positive and negative sequence voltage components at the motor terminals.

Re-arranging the negative sequence equation to isolate the negative sequence voltage at the motor terminals, $V_{2M}$, yields:

$$V_{2M} = \frac{1}{3}(V_a + a^2 V_b + aV_c) + \frac{1}{3}(V_{SFa} + a^2 V_{SFb} + aV_{SFc}).$$ [Eqn. 4]

Eqn. 4 is then rewritten as:

$$V_{2M} = V_2 + \frac{1}{3}(V_{SFa} + a^2 V_{SFb} + aV_{SFc}).$$ [Eqn. 5]

where $V_2$ is the observed negative sequence voltage at the sensing location on the supply side and $V_{SFa}, V_{SFb}, V_{SFc}$ are voltage gains observed when there is a stator fault in the phase A, B, C, respectively.

Rearranging Eqn. 5 yields:

$$V_{SFa} + a^2 V_{SFb} + aV_{SFc} = -3(V_2 - V_{2M})$$ [Eqn. 6].

According to one embodiment, the negative sequence voltage at the motor terminals, $V_{2M}$, can be estimated using impedance values in the electrical distribution circuit 10, along with the negative and positive sequence currents. More specifically:

$$V_{2M} = Z_{21}*I_1 + Z_{22}*I_2$$ [Eqn. 7], where $Z_{22}$ is the negative sequence impedance of the motor, $Z_{21}$ is the coupling impedance between the negative sequence voltage and the positive sequence current, $I_1$ is the positive sequence current, and $I_2$ is the negative sequence current.

Thus, in order to estimate the negative sequence voltage at the motor terminals, $V_{2M}$, the technique next estimates the negative sequence impedance $Z_{22}$ and the coupling impedance between the negative sequence voltage and the positive sequence current $Z_{21}$ at STEP 58. In estimating the impedances $Z_{22}$ and $Z_{21}$, it is assumed that the electrical machine is operating under healthy conditions (i.e., there is no stator winding fault in the motor windings). Assuming initially that there is no stator winding fault, than the negative sequence voltage (at a sensing location between the input 16 and output 18) is equal to the negative sequence voltage at the motor terminals (i.e., $V_2 = V_{2M}$). So, during initialization—assuming there is no stator winding fault present—the impedance parameters $Z_{21}$ and $Z_{22}$ can be estimated using a nonlinear recursive fit.

Upon estimation of the impedance parameters $Z_{21}$ and $Z_{22}$, Eqn. 7 may be implemented to determine the negative sequence voltage at the motor terminals, $V_{2M}$. Upon determination of the negative sequence voltage at the motor terminals, $V_{2M}$, technique 50 continues as STEP 60 with the determination of the negative sequence voltage due only to a stator winding fault, $V_{2SF}$—i.e., a "stator fault negative sequence voltage." The stator fault negative sequence voltage, $V_{2SF}$, can be determined according to:

$$V_{2SF} = V_2 - V_{2M}$$ [Eqn. 8].

By substituting Eqn. 8 into Eqn. 6, Eqn. 6 can be rewritten according to:

$$V_{SFa} + a^2 V_{SFb} + aV_{SFc} = -3V_{2SF}$$ [Eqn. 9].

Eqn. 9 may be used to derive the conditions and relations to quantify and localize voltage gain due to a stator winding fault in a single phase or multiple phases of the delta connected motor.

Referring still to FIG. 3, technique 50 continues at STEP 61 where it is determined whether the magnitude of the stator fault negative sequence voltage, $V_{2SF}$, is greater than a threshold voltage level, so as to enable a determination as to whether the stator fault negative sequence voltage is indicative of a stator fault in the distribution circuit 10. It is recognized that the threshold voltage level can be set dependent on the severity at which an alarm is to be raised, and thus the threshold could be a pre-defined value in the program or could be determined from user settings or using user inputs. According to an exemplary embodiment, the voltage threshold is set at 100 mV—such that voltage drops greater than 100 mV are categorized as a stator fault—although it is recognized that the threshold could be a higher or lower value. If it is determined at STEP 61 that stator fault negative sequence voltage, $V_{2SF}$, is less than the threshold voltage, as indicated at 62, then it is determined that there is no stator fault in the system, as indicated at STEP 63. The technique then loops back to STEP 52 with the receiving of additional three-phase current and voltage measurements by the processor 42, such that monitoring for a stator fault is continued.

Conversely, if it is determined at STEP 61 that the magnitude of the stator fault negative sequence voltage, $V_{2SF}$, is greater than the threshold voltage, as indicated at 64, then the technique 50 continues as STEP 65 with the calculation of a localization reference phase angle for the each phase in the distribution circuit 10/electrical machine 14. According to an exemplary embodiment, the localization reference phase angles computed at STEP 65 are derived in part by using the phase angle of the fundamental current flowing through each respective phase. Thus, for Phase A, the localization reference phase angle can be described by:

$$_{ref}\varphi_{2SFa} = 180 + \varphi_{fa},$$

where $\varphi_{fa}$ is the angle of the fundamental component of phase current flowing through Phase A.

For Phase B, the localization reference phase angle can be described by:

$$_{ref}\varphi_{2SFb} = 60 + \varphi_{fb},$$

where $\varphi_{fb}$ is the angle of the fundamental component of phase current flowing through Phase B.

For Phase C, the localization reference phase angle can be described by:

$$_{ref}\varphi_{2SFc} = 300 + \varphi_{fc},$$

where $\varphi_{fc}$ is the angle of the fundamental component of phase current flowing through Phase C.

Figure 4:
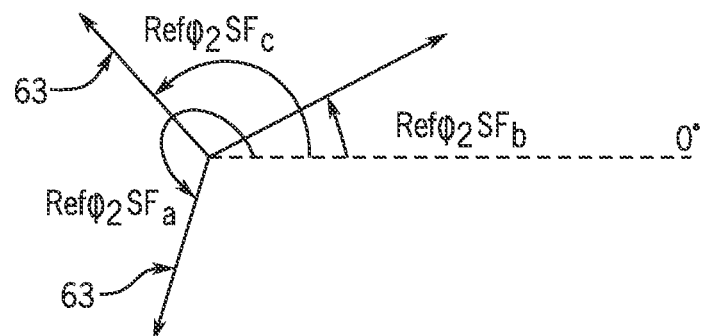
FIG. 4 is a phasor diagram illustrating localization reference phase angle phasors according to an embodiment of the invention.

A diagram of the localization reference phase angles computed at STEP 65 is provided in FIG. 4. As seen therein, each localization reference phase angle is in the form of a fault reference current phasor. The fault reference current phasors are spaced 120 degrees apart.

Upon determination of the localization reference phase angles at STEP 65, a calculation of a voltage gain attributed to a stator winding fault is next performed at STEP 66. A calculation of the voltage gain attributed to stator winding fault at STEP 66 may be described alternately as a calculation of an FSI—with the FSI being a phasor having a magnitude that is an indicator of the amount of voltage gain caused by a stator winding fault and an angle that indicates the phase or phases on which the voltage gain due to a stator winding fault is present. With respect to the magnitude of the FSI phasor, the amount of voltage gain is derived from the stator fault negative sequence voltage, $V_{2SF}$, as described in Eqn. 8—with the stator fault negative sequence voltage being broken down by phase as described in Eqn. 9. With respect to the angle of the FSI phasor, the phase or phases to which the stator winding fault (and accompanying voltage gain) is to be attributed to (i.e., localizing of the stator winding fault) is determined by a comparison of a phase angle of the stator fault negative sequence voltage to the localization reference phase angles for each phase.

Figure 5:
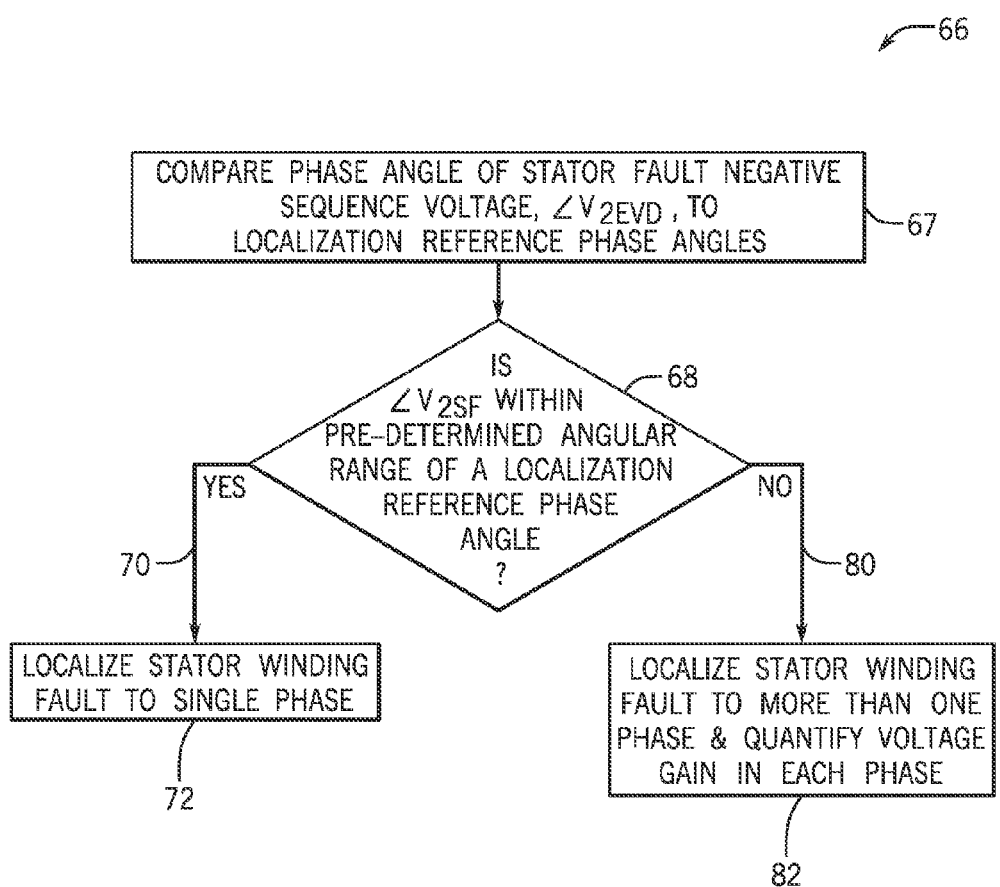
FIG. 5 is flowchart illustrating sub-steps of STEP 64 in FIG. 3 for localizing of an EVD to one or more phases in a three-phase AC circuit according to an embodiment of the invention.

Referring now to FIG. 5, the localizing of the stator winding fault to one or more phases that is performed at STEP 66 is further illustrated as a series of sub-steps. In a first step, the phase angle of the stator fault negative sequence voltage is compared to the localization reference phase angles for each phase of the distribution circuit—as indicated at STEP 67. A determination is then made at STEP 68 as to whether the phase angle of the stator fault negative sequence voltage is within a pre-determined angular range of any one of the localization reference phase angles. According to an exemplary embodiment, a determination is made at STEP 68 regarding whether the angle of the stator fault negative sequence voltage is within 15 degrees of any of the localization reference phase angles—i.e., plus or minus 15 degrees of angular range from each localization reference phase angle. It is recognized that the pre-determined difference between the phase angle of the stator fault negative sequence voltage, $V_{2SF}$, and the localization reference phase angles is not required to be within 15 degrees, as a different angular range could instead be selected.

If it is determined at STEP 68 that the phase angle of the stator fault negative sequence voltage is within a pre-determined angular range of any one of the localization reference phase angles, as indicated at 70, then the technique continues at STEP 72 by localizing the stator winding fault to the particular phase corresponding to the localization reference phase angle to which the angle of the stator fault negative sequence voltage is within the pre-determined angular range of Examples of the stator winding fault occurring on each of Phase A, B and C—and the describing thereof by way of Eqn. 9—are set forth here below for purposes of illustration.

In an occurrence where the stator winding fault is present in Phase A—i.e., $|(ref\varphi_{2SFa} - \angle V_{2SF})| < 15°$—then the voltage gains due to a stator winding fault in Phases B and C are described by $V_{SFb} = 0$ and $V_{SFc} = 0$, such that Eqn. 9 becomes:

$$V_{SFa} = 3 * V_{2SF} \qquad [\text{Eqn. 10}].$$

As the magnitude of the voltage gain is being sought, the term (1−a) can be removed from Eqn. 10, such that the voltage gain due to the stator winding fault in Phase A is calculated according to:

$$|V_{SFa}| = 3 * |V_{2SF}|.$$

Figure 6:
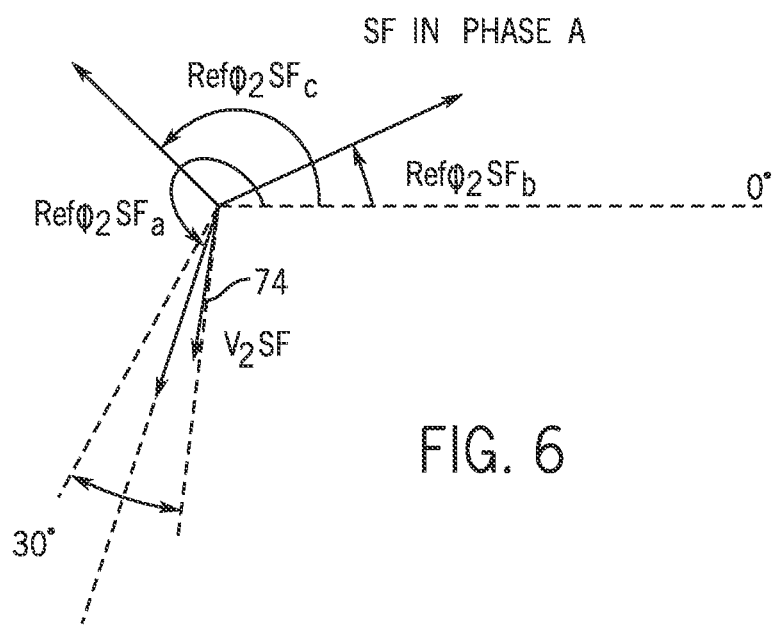
FIGS. 6-8 are phasor diagrams illustrating a negative sequence voltage caused by a stator winding fault in Phases A, B and C, respectively, of a three-phase AC circuit.

An illustration of a FSI phasor 74—having a magnitude indicating an amount of voltage gain and an angle indicating that the stator winding fault is in Phase A—is provided in FIG. 6. As shown therein, the FSI phasor has an angle that is within the pre-determined range of +/−15 degrees of the localization reference phase angle for Phase A.

In an occurrence where the stator fault is present in Phase B—i.e., $|(ref\varphi_{2SFb} - \angle V_{2SF})| < 15°$—then the voltage gains due to a stator winding fault in Phases A and C are described by $V_{SFa} = 0$ and $V_{SFc} = 0$, such that Eqn. 9 becomes:

$$a^2 * V_{SFb} = 3 * V_{SF} \qquad [\text{Eqn. 11}].$$

As the magnitude of the voltage gain is being sought, the term $a^2$ can be removed from Eqn. 11, such that the voltage gain due to the stator winding fault in Phase B is calculated according to:

$$|V_{SFb}| = 3 * |V_{2SF}|.$$

Figure 7:
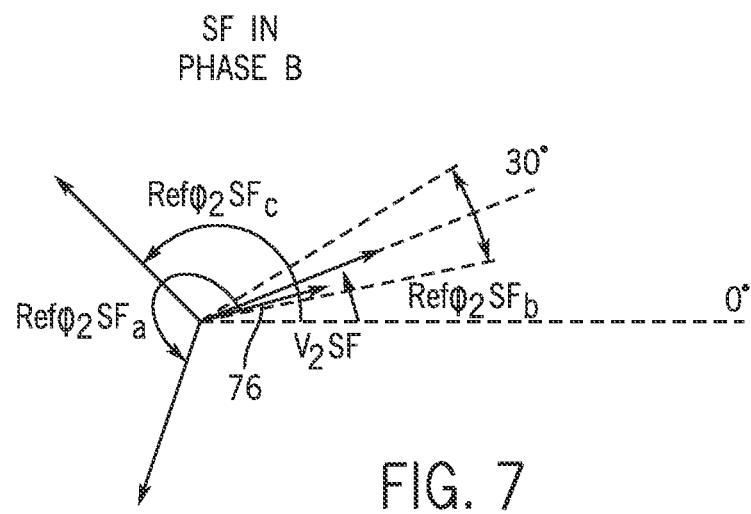

An illustration of a FSI phasor 76—having a magnitude indicating an amount of voltage gain and an angle indicating that the stator winding fault is in Phase B—is provided in FIG. 7. As shown therein, the FSI phasor has an angle that is within the pre-determined range of +/−15 degrees of the localization reference phase angle for Phase B.

In an occurrence where the stator winding fault is present in Phase C—i.e., $|(ref\varphi_{2SFc} - \angle V_{2SF})| < 15°$—then the voltage gains due to a stator winding fault in Phases A and B are described by $V_{SFa} = 0$ and $V_{SFb} = 0$, such that Eqn. 9 becomes:

$$a * V_{SFc} = 3 * V_{2EVDF} \qquad [\text{Eqn. 12}].$$

As the magnitude of the voltage gain is being sought, the term $(a-a^2)$ can be removed from Eqn. 12, such that the voltage gain due to the stator winding fault in Phase C is calculated according to:

$$|V_{SFc}| = 3*|V_{2SF}|.$$

Figure 8:
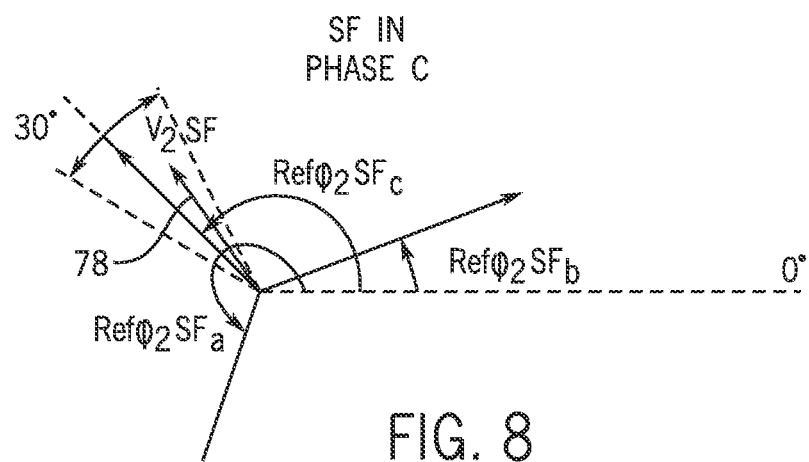

An illustration of a FSI phasor 78—having a magnitude indicating an amount of voltage gain and an angle indicating that the stator winding fault is in Phase C—is provided in FIG. 8. As shown therein, the FSI phasor has an angle that is within the pre-determined range of +/−15 degrees of the localization reference phase angle for Phase C.

Referring again now to FIG. 5, if it is instead determined at STEP 68 that the phase angle of the stator fault negative sequence voltage is not within a pre-determined angular range of any one of the localization reference phase angles, as indicated at 80, then the technique continues at STEP 82 by localizing the FSI (and the stator winding fault) to more than one phase of the electrical distribution system 10. In localizing the FSI to more than one phase, the FSI is resolved along multiple axes to quantify an amount of voltage gain in each of the phases to which the stator winding fault has been localized. That is, the magnitude of the FSI is proportioned amongst two or more phases to determine the amount of voltage gain in each of the phases. Examples of the stator winding fault occurring in differing combinations of Phases A, B and C—and the describing thereof by way of Eqn. 9—are set forth here below for purposes of illustration.

In an occurrence where the stator winding fault and accompanying voltage gain is present in Phases A and B—i.e., $\text{ref}\varphi_{2EVDSFa} < \angle V_{2SF} < \text{ref}\varphi_{2SFb}$—then the voltage gain due to a stator winding fault in Phase C is described by $V_{SFc}=0$, such that Eqn. 9 becomes:

$$V_{SFa} + a^2 V_{SFb} = -3 * V_{2SF} \quad \text{[Eqn. 13]},$$

In Eqn. 13, rewriting $V_{SFa}$ and $V_{SFb}$ in the complex domain gives:

$$V_{SFa} = |V_{SFa}|*(\cos \varphi_{fa} + j \sin \varphi_{fa})$$

$$V_{SFb} = |V_{SFb}|*(\cos \varphi_{fb} + j \sin \varphi_{fb}),$$

and substituting these values into Eqn. 13 results in:

$$|V_{SFa}|(\cos \varphi_{fa} + j \sin \varphi_{fa}) + |V_{SFb}|(\cos(\varphi_{fb}+240) + j \sin(\varphi_{fb}+240)) = -3*|V_{2SF}|*\{\cos(\varphi_{2SF}) + j \sin(\varphi_{2SF})\} \quad \text{[Eqn. 14]}.$$

Comparing the real and imaginary parts of Eqn. 14 yields:

$$|V_{SFa}|\cos \varphi_{fa} + |V_{SFb}|\cos(\varphi_{fb}+240) = -3*|V_{2SF}|*\cos(\varphi_{2SF})$$

$$|V_{SFa}|\sin \varphi_{fa} + |V_{SFb}|\sin(\varphi_{fb}+240) = -3*|V_{2SF}|*\sin(\varphi_{2SF}),$$

which when solved provides:

$$FSI_A = |V_{SFa}| = -3*|V_{2SF}| * \frac{\sin(\varphi_{fb} + 240 - \varphi_{2SF})}{\sin(\varphi_{fb} + 240 - \varphi_{fa})} \quad \text{[Eqn. 15]}$$

$$FSI_B = |V_{SFb}| = -3*|V_{2SF}| * \frac{\sin(\varphi_{fa} - \varphi_{2SF})}{\sin(\varphi_{fa} - \varphi_{fb} - 240)}.$$

Eqn. 15 thus enables the FSI to be resolved along multiple axes—Phases A and B—to quantify an amount of voltage gain in each of the phases to which a stator winding fault has been localized.

In an occurrence where the stator winding fault and accompanying voltage gain is present in Phases B and C—i.e., $\text{ref}\varphi_{2SFb} < \angle V_{2SF} < \text{ref}\varphi_{2SFc}$—then the voltage gain due to a stator winding fault in Phase A is described by $V_{SFa}=0$, such that Eqn. 9 becomes:

$$a^2 V_{SFb} + a V_{SFc} = -3*V_{2SF} \quad \text{[Eqn. 16]},$$

Similar to that described above, $V_{SFb}$ and $V_{SFc}$ can be rewritten in the complex domain and substituted back into Eqn. 16, with the real and imaginary parts being compared and solved to provide:

$$FSI_B = |V_{SFb}| = -3*|V_{2SF}| * \frac{\sin(\varphi_{fc} + 120 - \varphi_{2SF})}{\sin(\varphi_{fc} + 120 - \varphi_{fb} - 240)} \quad \text{[Eqn. 17]}$$

$$FSI_C = |V_{SFc}| = -3*|V_{2SF}| * \frac{\sin(\varphi_{fb} + 240 - \varphi_{2SF})}{\sin(\varphi_{fb} + 240 - \varphi_{fc} - 120)}.$$

Eqn. 17 thus enables the FSI to be resolved along multiple axes—Phases B and C—to quantify an amount of voltage gain in each of the phases to which a stator winding fault has been localized.

In an occurrence where the stator winding fault and accompanying voltage gain is present in Phases A and C—i.e., $\text{ref}\varphi_{2SFc} < \angle V_{2SF} < \text{ref}\varphi_{2SFa}$—then the voltage gain due to a stator winding fault in Phase B is described by $V_{SFb}=0$, such that Eqn. 9 becomes:

$$V_{SFa} + a V_{SFc} = -3 V_{2SF} \quad \text{[Eqn. 18]},$$

Similar to that described above, $V_{SFa}$ and $V_{SFc}$ can be rewritten in the complex domain and substituted back into Eqn. 18, with the real and imaginary parts being compared and solved to provide:

$$FSI_C = |V_{SFc}| = -3*|V_{2SF}| * \frac{\sin(\varphi_{fa} - \varphi_{2SF})}{\sin(\varphi_{fa} - \varphi_{fc} - 120)} \quad \text{[Eq. 19]}$$

$$FSI_A = |V_{SFa}| = -3*|V_{2SF}| * \frac{\sin(\varphi_{fc} + 120 - \varphi_{2SF})}{\sin(\varphi_{fc} + 120 - \varphi_{fa} + 30)}.$$

Eqn. 19 thus enables the FSI to be resolved along multiple axes—Phases C and A—to quantify an amount of voltage gain in each of the phases to which a stator winding fault has been localized.

Figure 9:
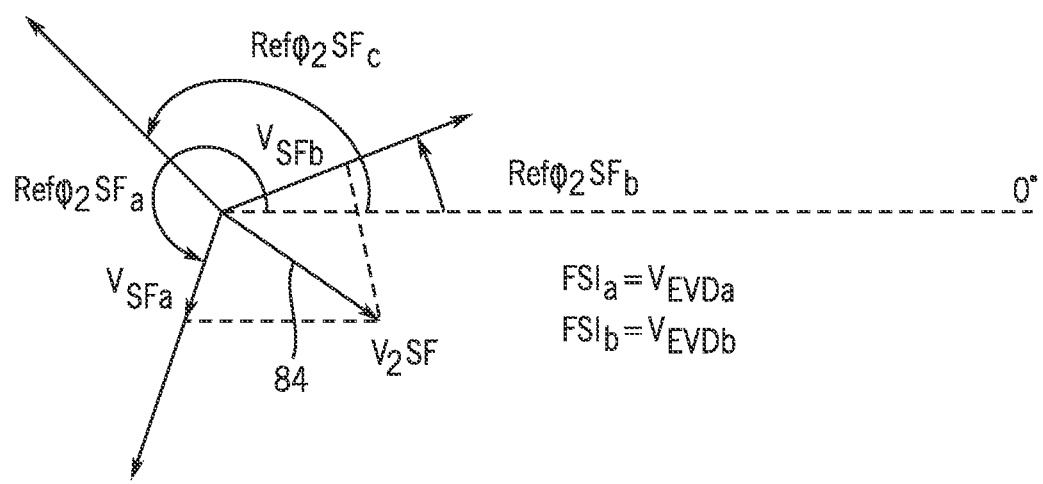
FIG. 9 is a phasor diagram illustrating a negative sequence voltage caused by a stator winding fault in more than one phase of a three-phase AC circuit.

An example of an FSI phasor present on more than one phase winding of the electrical machine is provided in FIG. 9—with the illustrated example showing an FSI phasor 84 present on Phases A and B of the electrical machine. The magnitude of the FSI phasor 84 indicates an amount of voltage gain, with the particular angle of the FSI phasor 84 being resolved to quantify the amount of voltage gain in each of Phase A and B.

Referring back now to FIG. 3, upon quantifying and localizing the voltage gain attributed to a stator winding fault at STEP 64, a conditions check for the stator turn fault is performed at STEP 86. In performing the check, the voltages across the motor terminal of each of Phases A, B, C due only to stator fault are respectively described as:

$$V_{aSF} = V_1 + V_{2SF}$$

$$V_{bSF} = a^2 * V_1 + a * V_{2SF}$$

$$V_{cSF} = a * V_1 + a^2 * V_{2SF}$$

where $V_1$ is the observed positive sequence voltage at a sensing location on the supply side and $V_{2SF}$ is the stator fault negative sequence voltage.

It is then checked at STEP 86 whether, for a phase identified as having a stator winding fault thereon, the magnitude of a voltage identified as being due only to stator fault across the respective motor terminal for that phase is greater than voltages across the other motor terminals that are due only to stator fault.

For a stator winding fault in Phase A:

$$|V_{aSF}|>|V_{bSF}|,|V_{cSF}|$$

For a stator winding fault in Phase B:

$$|V_{bSF}|>|V_{aSF}|,|V_{cSF}|$$

For a stator winding fault in Phase C:

$$|V_{cSF}|>|V_{aSF}|,|V_{bSF}|.$$

This condition check at STEP 86 can be performed to verify the presence of a stator winding fault for a particular phase.

While technique 50 is shown and described in FIG. 3 as specifically identifying, localizing, and quantifying stator winding fault(s) in electrical distribution circuit 10, it is recognized that embodiments of the invention can, on a higher level, identify a "resistance-based fault" in the circuit—including both stator winding faults and high resistance connection faults—and classify any identified resistance-based faults as either a stator winding fault or high resistance connection fault based on a voltage gain or voltage drop in a phase/phases that are attributable to the identified fault.

Figure 10:
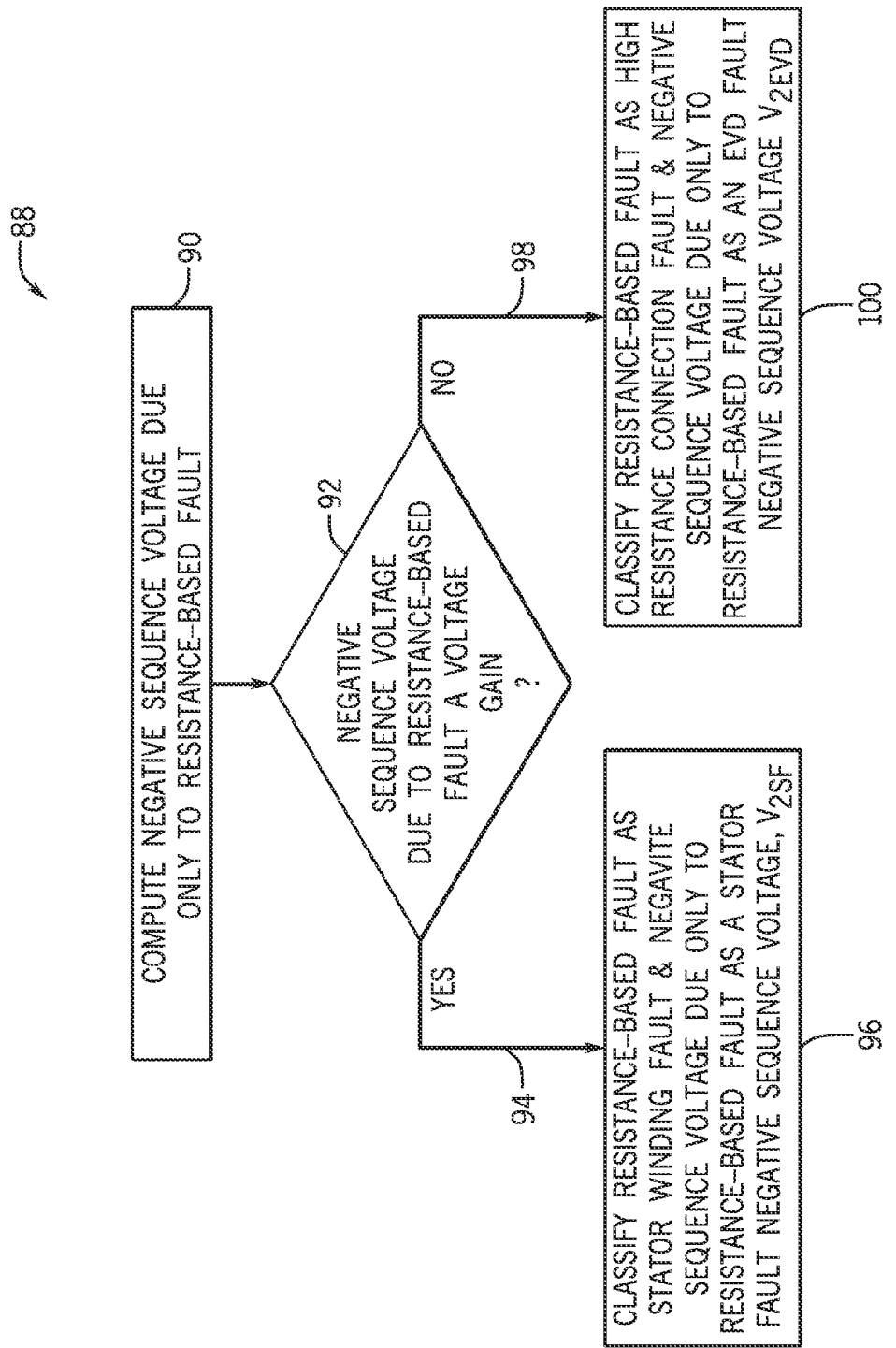
FIG. 10 is a flowchart illustrating a technique for differentiating between stator winding faults and high resistance connection faults in three-phase AC circuits according to an embodiment of the invention.

Referring now to FIG. 10, a technique 88 for classifying a resistance-based fault as either a stator winding fault or high resistance connection fault is illustrated according to an embodiment of the invention. In a first step of the technique 50, a negative sequence voltage due only to the resistance-base fault is computed at STEP 90. The computing of the negative sequence voltage due only to the resistance-base fault is performed as described in detail above regarding STEPS 52-60 of the technique 50 of FIG. 4 by employing a method of symmetrical components and performing subsequent processing and calculation steps to isolate and identify the negative sequence voltage due only to the resistance-base fault.

Upon a determination of the negative sequence voltage due only to the resistance-base fault, the technique 88 continues at STEP 92 with a determination of whether the negative sequence voltage due only to the resistance-base fault provides for a voltage gain (or conversely a voltage drop) in one or more phases of the electrical distribution circuit. If it is determined at STEP 92 that the negative sequence voltage due only to the resistance-base fault provides for a voltage gain in one or more phases of the electrical distribution circuit (i.e., has a positive value), as indicated at 94, then the technique continues at STEP 96 with the classifying of a resistance-base fault as a stator winding fault—and consequently the negative sequence voltage due only to the resistance-base fault is classified as a stator fault negative sequence voltage, $V_{2SF}$. Conversely, if it is determined at STEP 92 that the negative sequence voltage due only to the resistance-base fault provides for a voltage drop in one or more phases of the electrical distribution circuit (i.e., has a negative value), as indicated at 98, then the technique continues at STEP 100 with the classifying of a resistance-base fault as a high resistance connection fault—and consequently the negative sequence voltage due only to the resistance-base fault is classified as an excess voltage drop (EVD) negative sequence voltage, $V_{2EVD}$.

For purposes of further explaining the identifying of the negative sequence voltage due only to the resistance-base fault, Eqn. 9 is set forth again here below. Eqn. 9 characterizes a stator winding fault, with this characterization being based on the negative sequence voltage due to the resistance-based fault, $V_{2SF}$, being a negative voltage drop (i.e., a voltage gain)—as indicated by the "−3" value attached to $V_{2SF}$:

$$V_{SFa}+a^2V_{SFb}+aV_{SFc}=-3V_{2SF} \quad \text{[Eqn. 9]}.$$

Conversely, a high resistance connection fault can be described by:

$$V_{EVDa}+a^2V_{EVDb}+aV_{EVDc}=3V_{2EVD} \quad \text{[Eqn. 20]}.$$

where the "EVD" indicates an excess voltage drop. Eqn. 20 characterizes a high resistance connection fault, with this characterization being based on the negative sequence voltage due to the resistance-based fault, $V_{2EVD}$, being a positive voltage drop, as indicated by the "3" value attached to $V_{2EVD}$.

Accordingly, in technique 88, a resistance-based fault detected in one or more phases of the electrical distribution circuit 10 will be classified as a stator fault in the stator windings if a voltage gain in the one or more phases (attributed to the fault) is detected and will be classified as a high resistance fault between the input 16 and output 18 of the electrical distribution circuit 10 if a voltage drop in the one or more phases (attributed to the fault) is detected.

While examples are set forth above in which a resistance-based fault is localized to one or two phases, it is recognized that the resistance-based faults may be localized to all three phases of the distribution circuit/electrical machine. In cases where the voltage gain or voltage drop in each of the three phases varies greatly in severity, Eqn. 9 and Eqn. 20 can be used to quantify the voltage gain or voltage drop in each phase—i.e., the negative sequence voltage can be analyzed. In cases where there is exactly equal (or approximately equal) voltage gain or voltage drop in all three phases, the voltage gain or voltage drop in each phase can be localized and quantified by using the positive sequence equations according to:

$$V_{SFa}+a*V_{SFb}+a^2*V_{SFc}=-3*(V_1-V_{1M}) \quad \text{[Eqn. 21]},$$

where $V_1$ is the positive sequence voltage observed at a sensing location and $V_{1M}$ is the motor terminal positive sequence voltage.

The positive sequence voltage at the motor terminals, $V_{1M}$, can be determined according to:

$$V_{1M}=Z_{11}*I_1+Z_{12}*I_2 \quad \text{[Eqn. 22]},$$

where $Z_{11}$ is the positive sequence impedance of the motor, $Z_{12}$ is the coupling impedance between the positive sequence voltage and the negative sequence current, $I_1$ is the positive sequence current, and $I_2$ is the negative sequence current.

Beneficially, embodiments of the invention thus provide a system and method for detecting stator winding faults in three-phase electrical distribution circuits by using the three-phase voltages and currents provided to an electrical machine (e.g., AC motor) in the circuit—with such detecting of stator winding faults, and the online monitoring of the electrical distribution circuit in general, being performed from a location at the distribution circuit or at a location remote from the distribution circuit. As a stator winding fault in three-phase motor circuits leads to voltage unbalance at the motor terminals (i.e., a voltage gain at one or more of the terminals) and consequent current unbalance, a stator winding fault can be detected via the analysis and processing of measured three-phase voltages and currents. Embodiments of the invention also enable differentiation between a high resistance connection fault (e.g., due to a loose connection) that causes an EVD in the distribution circuit and a stator winding fault (e.g., due to degraded winding insulation) that causes an increase in voltage (voltage gain) in one or more phases in the distribution circuit 10. This differentiation between the two faults allows maintenance in the distribution circuit to be performed in a more flexible and efficient manner, since the course of action can be determined depending on the type and severity of the fault and the application.

A technical contribution for the disclosed method and apparatus is that it provides for a processor-implemented technique for detecting, localizing and quantifying excess voltage drops in three-phase AC motor circuits.

Therefore, according to one embodiment of the present invention, a diagnostic system in operable communication with an electrical distribution circuit and configured to detect a stator winding fault in an AC electrical machine comprising a plurality of stator windings is provided, with the diagnostic system including a processor programmed to receive measurements of three-phase voltages and currents provided to the AC electrical machine from voltage and current sensors associated with the electrical distribution circuit, compute positive, negative and zero sequence components of voltage and current from the three-phase voltages and currents, and calculate a fault severity index (FSI) based on at least a portion of the positive, negative and zero sequence components of voltage and current, wherein calculating the FSI further comprises identifying a voltage gain in one or more phases of the AC electrical machine due to a stator winding fault and localizing the stator winding fault to one or more phases in the AC electrical machine.

According to another embodiment of the present invention, an electrical distribution circuit includes an input connectable to an AC source and an output connectable to terminals of an electrical machine to provide three-phase power thereto, the electrical machine comprising a plurality of stator windings. The electrical distribution circuit also includes a diagnostic system configured to identify a stator fault in the stator windings of the electrical machine, the diagnostic system including a processor that is programmed to receive measurements of three-phase supply voltages and currents provided to the electrical machine from voltage and current sensors connected to the electrical distribution circuit between the input and the output, compute positive, negative, and zero sequence components for the supply voltages and currents, determine a stator fault negative sequence voltage from the negative sequence voltage component, determine a localization reference phase angle for each phase based in part on fundamental components of the three-phase currents, and identify and localize a stator fault in the electrical distribution circuit based on the stator fault negative sequence voltage and the localization reference phase angles.

According to yet another embodiment of the present invention, a method for identifying a resistance-based fault in an electrical distribution circuit includes measuring three-phase voltages and currents provided to terminals of an electrical machine in the electrical distribution circuit by way of voltage and current sensors, the electrical machine comprising a plurality of stator windings. The method also includes causing a diagnostic system to identify a resistance-based fault in the electrical distribution circuit and the stator windings of the electrical machine, wherein causing the diagnostic system to identify the resistance-based fault includes receiving the measured three-phase voltages and currents provided to the terminals of the electrical machine, computing a positive, negative, and zero sequence voltage and sequence current from the measured three-phase voltages and currents, detecting a voltage gain or voltage drop in one or more phases of the electrical distribution circuit using the positive, negative and zero sequence components of voltage and current and identifying a resistance-based fault in one or more phases of the electrical distribution circuit based on the detected voltage gain or voltage drop, wherein identifying the resistance-based fault comprises classifying the resistance-based fault as a high resistance fault between the input and output of the electrical distribution circuit if a voltage drop is detected and classifying the resistance-based fault as a stator fault in the stator windings if a voltage gain is detected.

The present invention has been described in terms of the preferred embodiment, and it is recognized that equivalents, alternatives, and modifications, aside from those expressly stated, are possible and within the scope of the appending claims.

What is claimed is:

1. A diagnostic system in operable communication with an electrical distribution circuit and configured to detect a stator winding fault in an AC electrical machine comprising a plurality of stator windings, the diagnostic system comprising:
   a processor programmed to:
      receive measurements of three-phase voltages and currents provided to the AC electrical machine, the measurements being received from voltage and current sensors associated with the electrical distribution circuit;
      compute positive, negative and zero sequence components of voltage and current from the three-phase voltages and currents; and
      calculate a fault severity index (FSI) based on at least a portion of the positive, negative and zero sequence components of voltage and current, wherein calculating the FSI comprises:
         identifying a voltage gain in one or more phases of the AC electrical machine due to a stator winding fault; and
         localizing the stator winding fault to one or more phases in the AC electrical machine.

2. The diagnostic system of claim 1 wherein, in calculating the FSI, the processor is further programmed to:
   estimate a motor terminal negative sequence voltage; and
   estimate a stator fault negative sequence voltage based on the negative sequence voltage and based on the motor terminal negative sequence voltage.

3. The diagnostic system of claim 2 wherein the processor is further programmed to:
   compare the stator fault negative sequence voltage to a voltage threshold; and
   if the stator fault negative sequence voltage is greater than the voltage threshold, then identify the stator fault negative sequence voltage as a stator fault in the AC electrical machine;
   otherwise, determine that there is no stator fault in the AC electrical machine.

4. The diagnostic system of claim 2 wherein, in calculating the FSI, the processor is further programmed to:
   determine a localization reference phasor for each phase based in part on the fundamental components of the three-phase power;
   identify a stator winding fault in the AC electrical machine based on a magnitude of the stator fault negative sequence voltage; and localize the stator fault to one or more phases of the AC electrical machine based on a difference between a phase angle of the stator fault negative sequence voltage and the localization reference phasors.

5. The diagnostic system of claim 4 wherein, in localizing the stator fault, the processor is further programmed to:
determine the phase angle of the stator fault negative sequence voltage;
compare the phase angle of the stator fault negative sequence voltage to an angle of each localization reference phasor for each phase; and
localize the stator fault to one of the phases if an angular difference between the phase angle of the stator fault negative sequence voltage and one of the localization reference phasors is less than a pre-determined amount;
otherwise, if the angular difference is greater than the pre-determined amount, then localize the stator fault to more than one phase, with an amount of stator fault in each of the more than one of phases to which the stator fault has been localized being separately quantified.

6. The diagnostic system of claim 5 wherein the pre-determined angular range is plus or minus 15 degrees.

7. The diagnostic system of claim 4 wherein the processor is further programmed to identify the stator winding fault in the AC electrical machine and localize the stator fault to one or more phases of the AC electrical machine according to:

$$V_{SFa}+a^2V_{SFb}+aV_{SFc}=-3V_{2SF},$$

where $$a = 1\angle 120 = -0.5 + j\frac{\sqrt{3}}{2},$$

$V_{SFa}$, $V_{SFb}$, $V_{SFc}$ are voltage gains in phase A, B, C indicating a stator fault, and $V_{2SF}$ is the stator fault negative sequence voltage.

8. The diagnostic system of claim 1 wherein, in calculating the FSI, the processor is further programmed to:
identify a voltage drop in the electrical distribution circuit due to a high resistance connection; and
localize the high resistance connection to one or more phases in the electrical distribution circuit.

9. The diagnostic system of claim 8 wherein the processor is further programmed to distinguish between a stator fault and a high resistance connection based on the voltage drop or voltage gain identified in the FSI.

10. The electrical distribution circuit of claim 1 wherein the processor is further programmed to determine fundamental components of the three-phase voltages and currents provided to the AC electrical machine, and wherein the positive, negative and zero sequence components of voltage and current are determined from the fundamental components.

11. An electrical distribution circuit comprising:
an input connectable to an AC source;
an output connectable to terminals of an electrical machine to provide three-phase power thereto, the electrical machine comprising a plurality of stator windings; and
a diagnostic system configured to identify a stator fault in the stator windings of the electrical machine, the diagnostic system comprising a processor that is programmed to:
receive measurements of three-phase supply voltages and currents provided to the electrical machine, the measurements of the three-phase supply voltages and currents provided from voltage and current sensors connected to the electrical distribution circuit between the input and the output;
compute positive, negative, and zero sequence components for the three-phase supply voltages and currents;
determine a stator fault negative sequence voltage from the negative sequence component of the three-phase supply voltages;
determine a localization reference phase angle for each phase based in part on fundamental components of the three-phase supply currents; and
identify and localize a stator fault in the electrical distribution circuit based on the stator fault negative sequence voltage and the localization reference phase angles.

12. The electrical distribution circuit of claim 11 wherein the stator fault negative sequence voltage comprises a complex value voltage phasor having a magnitude indicating an amount of voltage gain in the stator windings and an angle indicating the one or more phases in the stator winding in which the voltage gain is present.

13. The electrical distribution circuit of claim 12 wherein the processor is further programmed to localize the voltage gain to one or more phases based on a comparison of a phase angle of the stator fault negative sequence voltage to the localization reference phase angles for each phase.

14. The electrical distribution circuit of claim 13 wherein, in localizing the voltage gain to one or more phases, the processor is further programmed to:
localize the stator fault to one of the phases if a difference between the phase angle of the stator fault negative sequence voltage and one of the localization reference phase angles is within a pre-determined angular range; and
localize the voltage gain to more than one phase if the difference between the phase angle of the stator fault negative sequence voltage and one of the localization reference phase angles is not within the pre-determined angular range, with an amount of voltage gain in each of the more than one phases to which the voltage gain has been localized being quantified.

15. The electrical distribution circuit of claim 13 wherein the processor is further programmed to identify the stator fault in the AC electrical machine and localize the stator fault to one or more phases according to:

$$V_{SFa}+a^2V_{SFb}+aV_{SFc}=-3V_{2SF},$$

where $$a = 1\angle 120 = -0.5 + j\frac{\sqrt{3}}{2},$$

$V_{SFa}$, $V_{SFb}$, $V_{SFc}$ are voltage gains in phase A, B, C indicating a stator fault, and $V_{2SF}$ is the stator fault negative sequence voltage.

16. The electrical distribution circuit of claim 12 wherein the processor is further programmed to:
identify a high resistance connection between the input and output of the electrical distribution circuit based on a voltage drop determined from the negative sequence voltage and the localization reference phase angles; and distinguish between a stator fault and a high resistance connection based on the identified voltage gain or voltage drop in the electrical distribution circuit.

17. The electrical distribution circuit of claim 11 wherein the processor is further programmed to:
   estimate a motor terminal negative sequence voltage based on impedance values of the electrical machine and the negative and positive sequence currents; and
   estimate the stator fault negative sequence voltage based on the negative sequence voltage and based on the motor terminal negative sequence voltage.

18. A method for identifying a resistance-based fault in an electrical distribution circuit, the method comprising:
   measuring three-phase voltages and currents provided to terminals of an electrical machine in the electrical distribution circuit by way of voltage and current sensors, the electrical machine comprising a plurality of stator windings;
   causing a diagnostic system to identify a resistance-based fault in the electrical distribution circuit and the stator windings of the electrical machine, wherein causing the diagnostic system to identify the resistance-based fault comprises:
      receiving the measured three-phase voltages and currents provided to the terminals of the electrical machine;
      computing a positive, negative, and zero sequence voltage and sequence current from the measured three-phase voltages and currents;
      detecting a voltage gain or voltage drop in one or more phases of the electrical distribution circuit using the positive, negative and zero sequence components of voltage and current; and
      identifying a resistance-based fault in one or more phases of the electrical distribution circuit based on the detected voltage gain or voltage drop, wherein identifying the resistance-based fault comprises:
         classifying the resistance-based fault as a high resistance fault between the input and output of the electrical distribution circuit if the voltage drop is detected; and
         classifying the resistance-based fault as a stator fault in the stator windings if the voltage gain is detected.

19. The method of claim 18 wherein identifying the resistance-based fault comprises calculating a fault severity index (FSI), the FSI comprising a voltage phasor having a magnitude indicating an amount of voltage gain or voltage drop in the electrical distribution circuit and an angle indicating the phase or phases in the electrical distribution circuit in which the voltage gain or voltage drop is present.

20. The method of claim 19 wherein calculating the FSI further comprises localizing the voltage phasor of the FSI to one or more phases in the three-phase output, wherein localizing the voltage phasor comprises:
   determining a phase angle of the voltage phasor;
   comparing the phase angle of the voltage phasor to a localization reference phase angle for each of the phases;
   determining if a difference between the phase angle of the voltage phasor and one of the localization reference phase angles is within a pre-determined angular range; and
   localizing the voltage phasor to one phase if the difference between the phase angle of the voltage phasor and one of the localization reference phase angles is within the pre-determined angular range;
   otherwise, if the difference between the phase angle of the voltage phasor and one of the localization reference phase angles is not within the pre-determined angular range, then localizing the voltage phasor to more than one phase, with an amount of voltage gain or voltage loss in each of the more than one phases being quantified.

* * * * *